United States Patent [19]
Medal

[11] Patent Number: 5,861,072
[45] Date of Patent: Jan. 19, 1999

[54] ULTRASONIC ENERGY DIRECTING ATTACHMENT OF PLASTIC PARTS TO ONE ANOTHER

[75] Inventor: James Medal, Cape Coral, Fla.

[73] Assignee: Unimation, Inc., Fort Myers, Fla.

[21] Appl. No.: 717,800

[22] Filed: Sep. 23, 1996

Related U.S. Application Data

[63] Continuation-in-part of Ser. No. 650,988, May 21, 1996, Pat. No. 5,769,256, which is a continuation-in-part of Ser. No. 452,356, May 30, 1995, abandoned, which is a continuation-in-part of Ser. No. 84,699, Jun. 29, 1993, Pat. No. 5,391,031, which is a continuation-in-part of Ser. No. 887,722, May 22, 1992, Pat. No. 5,222,850.

[51] Int. Cl.$^6$ ..................................................... B32B 31/16
[52] U.S. Cl. ....................... 156/73.1; 156/309.6; 264/445
[58] Field of Search ................................. 156/73.1, 308.2, 156/308.4, 309.6, 580.1, 580.2; 264/442, 443, 445

[56] References Cited

U.S. PATENT DOCUMENTS

| | | | |
|---|---|---|---|
| 3,278,356 | 10/1966 | Katz | 156/294 |
| 3,661,661 | 5/1972 | Berleyoung | 156/73.1 |
| 3,819,437 | 6/1974 | Paine | 156/73.1 |
| 4,169,751 | 10/1979 | Yen | 156/73.1 |
| 4,211,923 | 7/1980 | Fukuyama et al. | 250/239 |
| 4,230,757 | 10/1980 | Toner | 428/137 |
| 4,293,359 | 10/1981 | Jakobsen | 156/156 |
| 4,326,902 | 4/1982 | Peddie | 156/73.1 |
| 4,368,826 | 1/1983 | Thompson | 215/100 A |
| 4,564,932 | 1/1986 | Langé | 369/286 |
| 4,618,516 | 10/1986 | Sager | 428/35 |
| 4,767,492 | 8/1988 | Fukusima et al. | 156/580.2 |
| 4,834,819 | 5/1989 | Todo et al. | 156/73.1 |
| 4,931,114 | 6/1990 | Sliva | 156/73.1 |
| 5,040,357 | 8/1991 | Ingemann | 53/478 |
| 5,269,917 | 12/1993 | Stankowski | 210/232 |
| 5,316,603 | 5/1994 | Akazawa et al. | 156/69 |
| 5,401,342 | 3/1995 | Vincent et al. | 156/73.1 |
| 5,403,415 | 4/1995 | Schembri | 156/73.1 |
| 5,435,863 | 7/1995 | Frantz | 156/64 |
| 5,535,901 | 7/1996 | Ishii et al. | 215/396 |
| 5,599,411 | 2/1997 | Schembri | 156/73.1 |
| 5,622,579 | 4/1997 | Tobias | 156/73.1 |

FOREIGN PATENT DOCUMENTS

| | | |
|---|---|---|
| 55-121024 | 9/1980 | Japan . |
| 2 088 986 | 10/1981 | United Kingdom . |

*Primary Examiner*—James Sells
*Attorney, Agent, or Firm*—Fitch, Even, Tabin & Flannery

[57] ABSTRACT

Two plastic pieces such as a handle and a container are welded together using an ultrasonic horn. Protrusions serving as energy directors are arranged on one piece in a substantially circular array, in a starburst design. A hole or cavity is formed at a central axis of the circular array so that the amount of energy concentrating at inner ends of the energy directors will not create a burned spot or a hole in the container. The ultrasonic energy at the inner ends of the protrusions is concentrated at the smaller inner area defined by the inner ends of the protrusions to first melt inner ends of the protrusions and then the entire protrusions.

5 Claims, 7 Drawing Sheets

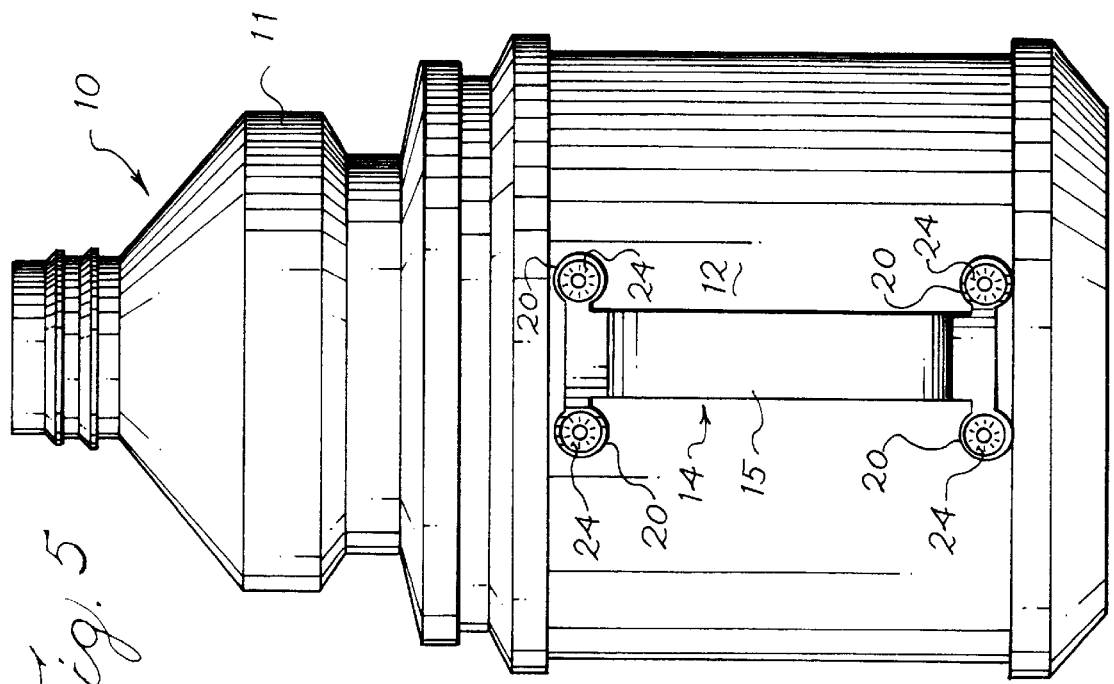
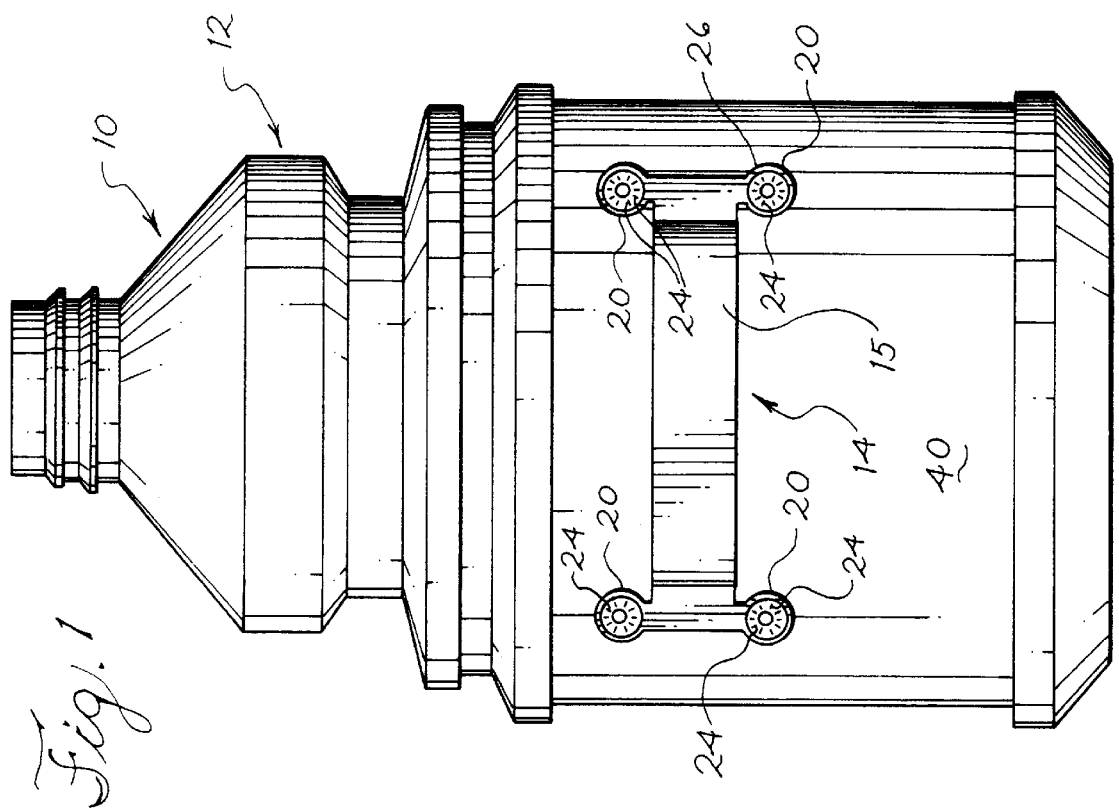

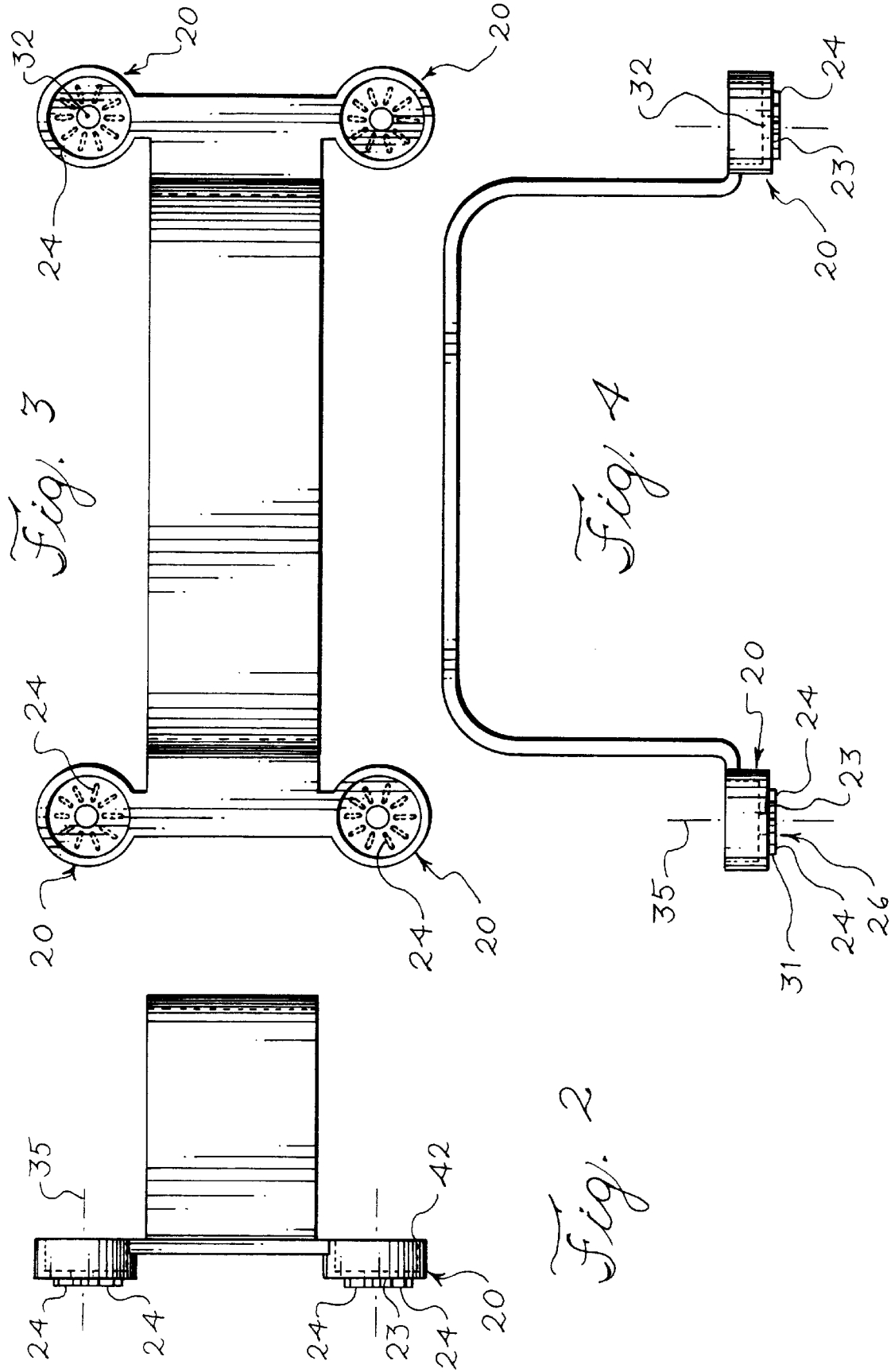

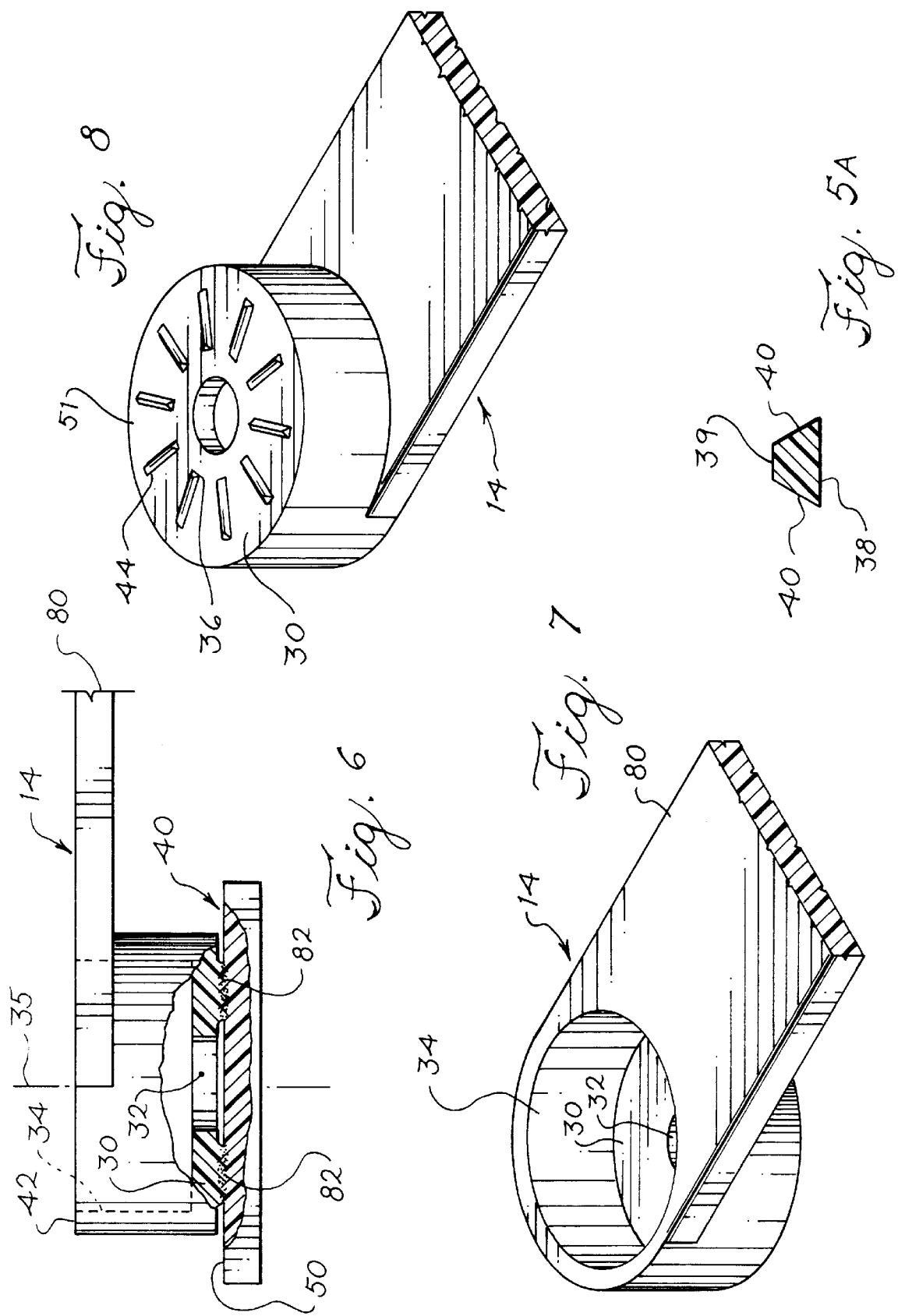

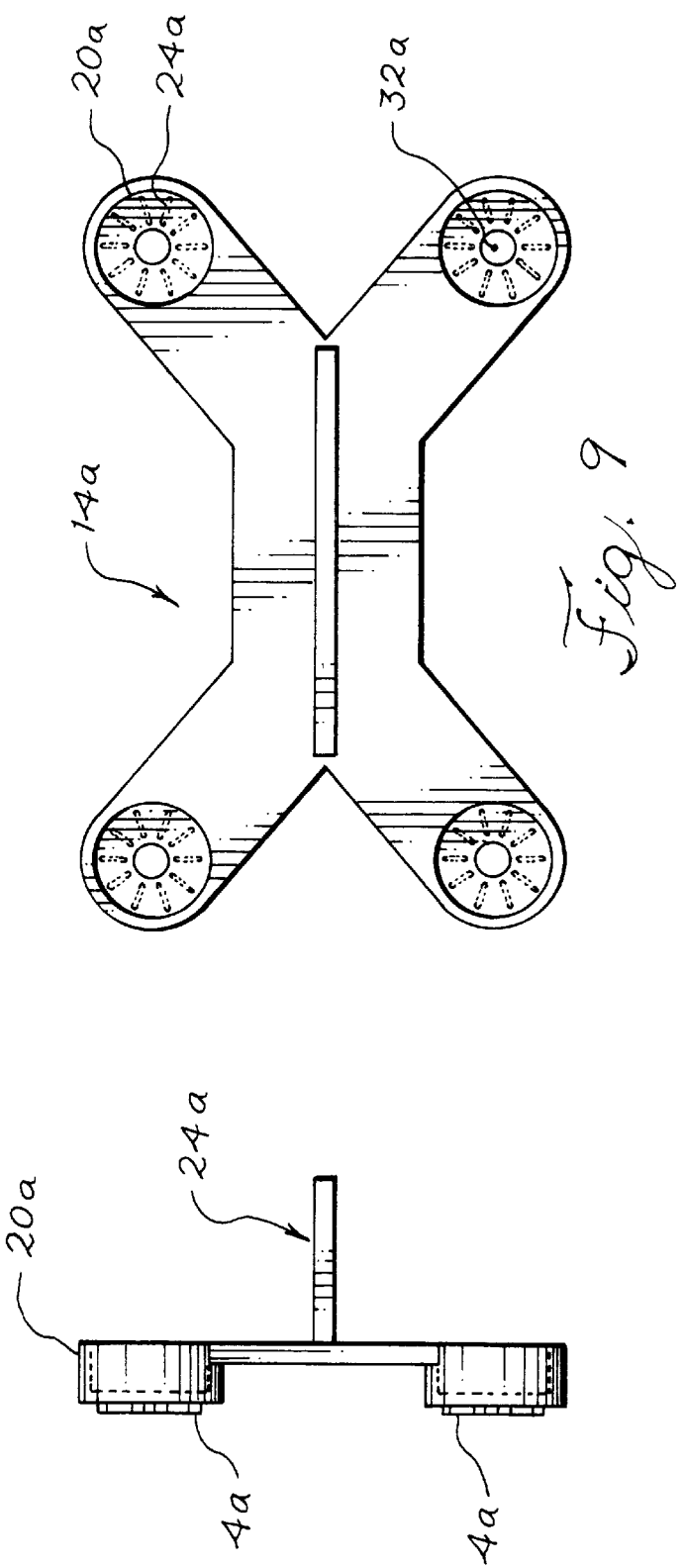

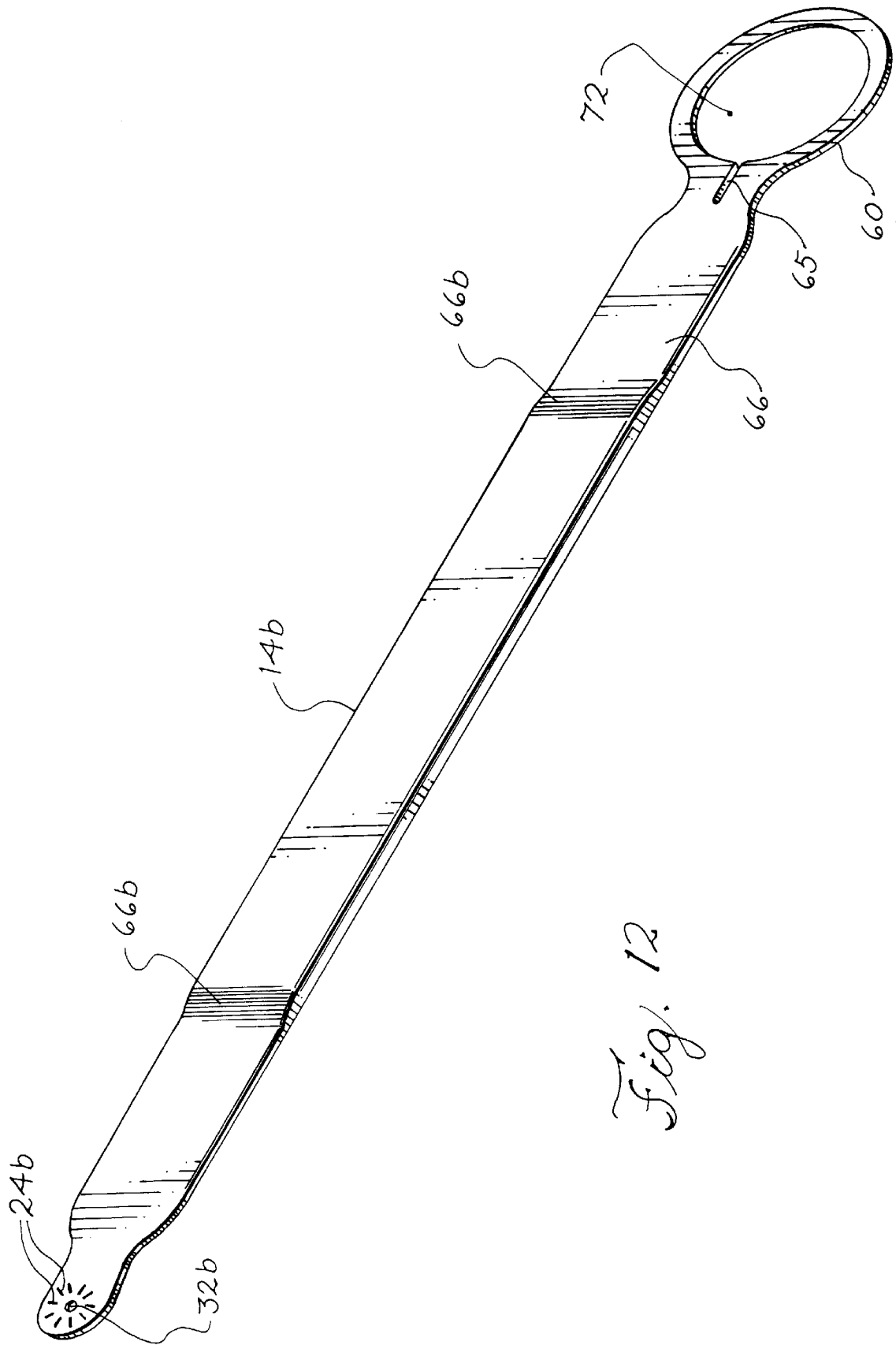

ULTRASONIC ENERGY DIRECTING ATTACHMENT OF PLASTIC PARTS TO ONE ANOTHER

FIELD OF THE INVENTION

This application is a Continuation-In-Part application of application Ser. No. 650,988 filed May 21, 1996, now U.S. Pat. No. 5,769,256, which, in turn, is a Continuation-In-Part of application Ser. No. 452,356 filed May 30, 1995, now abandoned which is a Continuation-In-Part application of application Ser. No. 084,699 filed Jun. 29, 1993, now U.S. Pat. No. 5,391,031 which, in turn, a Continuation-In-Part application of application Ser. No. 887,722 filed May 22, 1992, now U.S. Pat. No. 5,222,850.

BACKGROUND OF THE INVENTION

Molded plastic parts have becoming increasingly popular, due at least in significant part to their low production cost. Hence, often, one or more components of an assembly are formed of molded plastic. In assembling a final product it is often necessary to fasten the molded plastic parts to other components to produce the final product.

The present invention is of particular use to molders of plastic parts, such as molded plastic shells or bodies, who desire to attach another plastic member to the body and/or to assemblers who desire to attach a first plastic material member to a second plastic material member. The present invention will be described in connection with an illustrated embodiment wherein a hollow, plastic container e.g., made of polyethylene terephthalate (PET) plastic has a thin wall to which it is desired to secure a separate handle e.g., of PET or of a polycarbonate plastic in the shape of a loop, but is not limited to these examples. When lifting or pouring liquid from the container, the user may insert his fingers into the loop and grip the outer portion of the loop. When making such containers it may be desirable to be able to use handles of a different thickness or a shape that would be difficult to mold integrally with the container or of a different material than the container material. Some plastics such as PET are most desirable for containers, such as bottles or drinking cups, because of its clarity, crystalline appearance, toughness, etc.; but PET may be a difficult material to which to attach handles when using conventional attaching techniques. The present invention is not limited to PET material because for many other plastic objects, such as for the PET container piece, it is desired to provide a good attachment between the first plastic piece and a second plastic piece such as a handle. While ultrasonic welding of plastic pieces together is well known, the piece shapes are not specifically designed to direct or concentrate the ultrasonic energy to achieve the initial energy direction and concentration to cause a good integral bond between the pieces. In these instances, one will find the PET plastic is usually not directly molded into its final shape by an injection molding as are many other containers such as, for example, polyethylene plastic containers. Rather, the PET plastic is first injection molded into a small preform which is then blown into the final enlarged container shape. With such preforms, often it is not economically feasible to have a handle thereon to be blown into a larger size or to attach a separate handle thereto using conventional techniques. Often for larger sizes of PET containers, e.g., a three liter container, it is desirable to attach a handle for ease in pouring the contents from the container.

The present invention is also directed to applications where, heretofore, one or more plastic pieces have been secured together by metallic screws and it is desirable to eliminate the metallic screws and to secure the members together using an improved plastic fastening system. In other instances, pieces have been heat staked together and it is desired to replace heat staking of components together with a better plastic fastening system than a heat staking system.

SUMMARY OF THE INVENTION

In accordance with the present invention, two plastic pieces are joined together by providing energy directing protrusions arranged in a substantially circular array on a first plastic piece and exerting a force between the protrusions and the second plastic piece and applying ultrasonic energy which is directed to and concentrates at protrusions to create localized heat to melt them quickly. The preferred circular array is in the shape of a starburst design with the energy directing projects having outer ends extending inwardly toward a common center and stopping short of one another. In the preferred embodiment, a hole or cavity is formed at the center of the starburst so that the greater amount of ultrasonic energy being radiated inwardly along the protrusions is not concentrated as would create an extreme amount of heat at the center of the starburst design that could create a burn or hole in the bottle, i.e., the second part. The starburst design provides a large area of weld to the second part, i.e., the weld covers more surface area.

Preferably, there is a surrounding, upwardly extending wall on the first part surrounding the starburst array of energy directors. The ultrasonic horn contacts this upward-projecting, annular wall and the vibrations pass down through this encircling wall to the outer ends of each of the energy directing protrusions simultaneously and then the vibrations pass radially inwardly along each of the protrusions toward their inner ends which concentrate the heat because of the smaller, inner diameter area at the inner ends of the protrusions than the larger, outer diameter area at the outer ends of the protrusions. This appears to melt only the top or outer surface of the plastic container for melding with the plastic of the protrusions. In pull tests, it is preferred that if the weld is broken by delaminating, that is, separating, the welded first or second portions separate from one another so that there will not be a hole in the container to leak its contents. In the illustrated embodiment of the invention, the first piece is a container handle which has energy directing, spaced protrusions thereon, usually projecting from a face wall of a boss, having a boss wall. The boss and container outer wall are pushed together with force and ultrasonic energy is applied, and ultrasonic energy is directed to and concentrates the vibrations at the protrusions causing them to heat and to melt initially and causing the container plastic in contact with the protrusions to melt and to intermix with the protrusions. As the protrusions melt at spaced points, then the face wall of the boss moves into engagement with the container wall and the melted plastic face wall and the opposite abutted melted plastic of container flow together and intermix.

In another embodiment of the invention, a starburst array of spaced protrusions on the boss serve energy directors or concentrators for ultrasonic energy applied thereto to cause the protrusions to melt quickly, and to fuse quickly into the surrounding melted plastic of another plastic member. In the preferred embodiment of the invention, the boss has a cylindrical wall to which the ultrasonic horn is applied and has a hole at the center of the array of protrusions. The present invention is useful to secure members that are otherwise considered difficult to fuse to a plastic, such as a PET container and a polycarbonate handle.

BRIEF DESCRIPTION OF THE DRAWINGS

FIG. 1 is a front elevational view of a first plastic element, such as a container, having a second plastic element, such as a handle, secured by bosses and energy directors thereon in accordance with the preferred embodiment of the invention;

FIG. 2 is an end view of the handle shown in FIG. 1;

FIG. 3 is a front elevational view of the handle shown in FIG. 1;

FIG. 4 is a side elevational view of the handle shown in FIG. 1;

FIG. 5 is a view similar to FIG. 1, but with the handle oriented vertically instead of horizontally;

FIG. 5A is an enlarged cross-sectional view of a protrusion;

FIG. 6 illustrates a second member having an integral boss with energy directors attached to a first member;

FIG. 7 is a perspective view of the second member and boss of FIG. 6;

FIG. 8 is a bottom, perspective view of the second member and boss shown in FIG. 6;

FIG. 9 is a view of a handle, in accordance with a further embodiment, with bosses having a starburst array of energy directors thereon;

FIG. 10 is a side elevational view of the handle of FIG. 9;

FIG. 11 is an end elevational view of the handle of FIG. 9;

FIG. 12 is a perspective view of still another embodiment of a handle having a starburst array of energy directors at one end thereof.

DETAILED DESCRIPTION OF THE PREFERRED EMBODIMENT

Figure 12A:
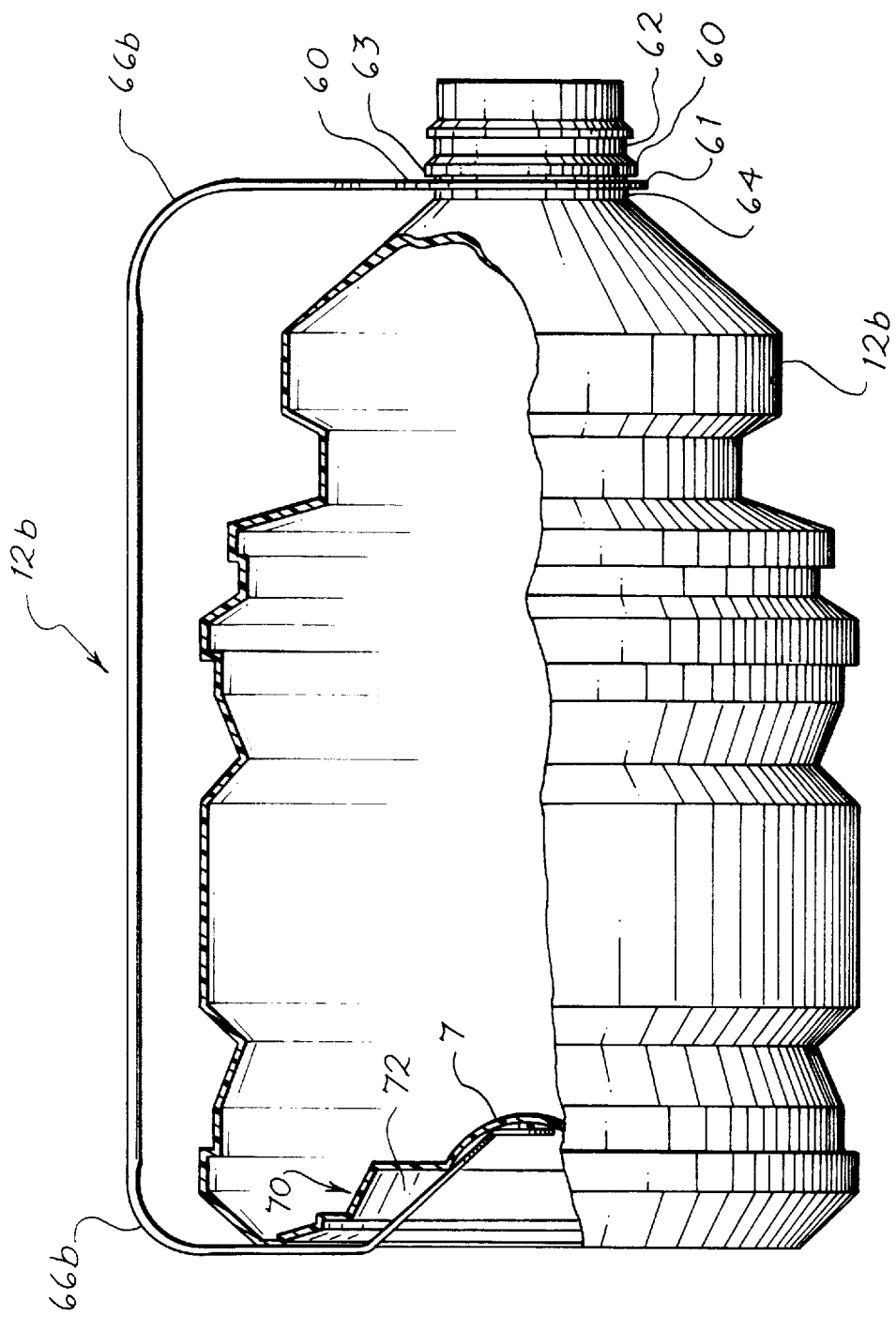
FIG. 12A is a view of a container with the handle of FIG. 12 attached to the container.

As shown in the drawings, for purposes of illustration, the invention is embodied in a first plastic member 10, such as a container 12 having a thin wall to which is attached a second member 14 (FIG. 1) such as a handle or other plastic body. Typically, the container wall has a thin cross-section, e.g., under 0.025 inch and is often made of a plastic that is difficult to fuse, such as PET, particularly in securing other plastic objects thereto. Often, the second member, such as the handle 14, are of a shape or a different material that cannot be integrally molded with the plastic body. In formation of PET containers, a small preform is injected molded and then the preform is blown to full, and it is desired to attach a full size handle to the full size container. In this illustrated embodiment of the invention, the container is made of a PET plastic and the handle is made of either PET or of polycarbonate material although other plastic materials may be used for the container and/or handle.

In accordance with the present invention, the second plastic body 14 is provided with a plastic boss 20. The boss 20 has energy directors 24 in the shape of spaced protrusions 24 which are melted and mixed with plastic of the container wall 12 to form a good strong connection therewith. In the embodiments of FIGS. 1–5, FIGS. 9–11 and FIGS. 12 and 12A, a plurality of bosses 20 are integrally formed with the plastic handle with the energy directing protrusions 24 that project outwardly from an end wall surface 23 of the boss bottom wall 30.

Figure 13:
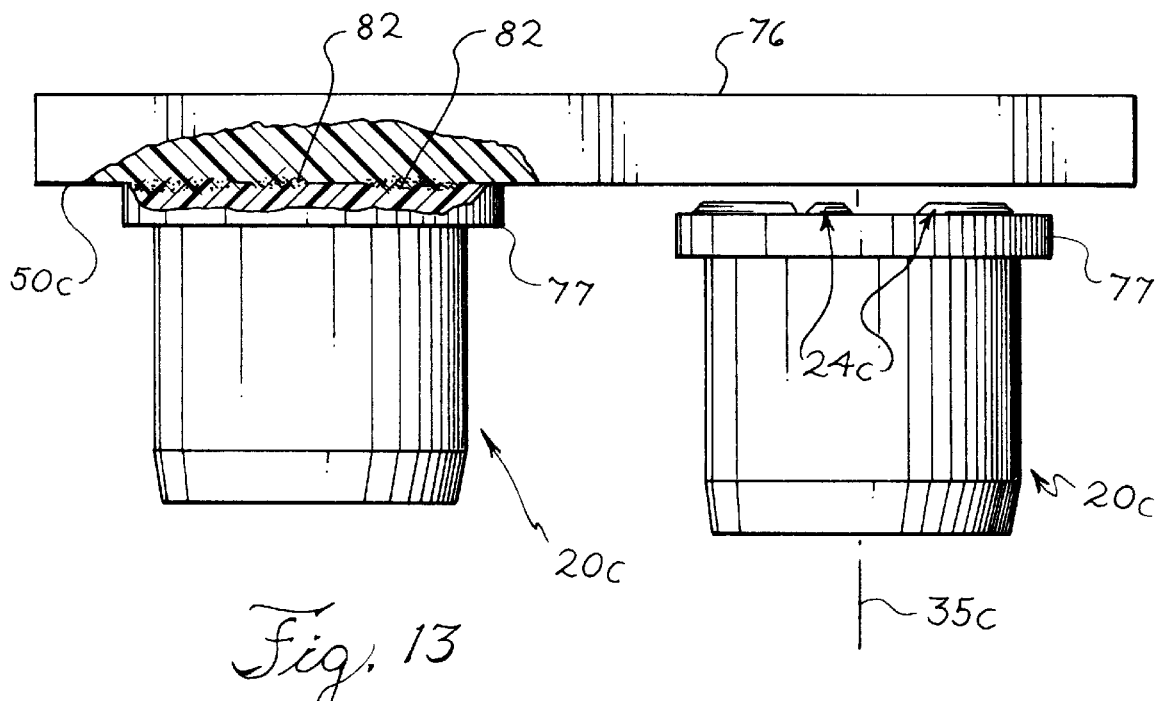
FIG. 13 shows the melding of the plastics from the energy directors of a first part and the wall of a second part.
Figures 14, 15:
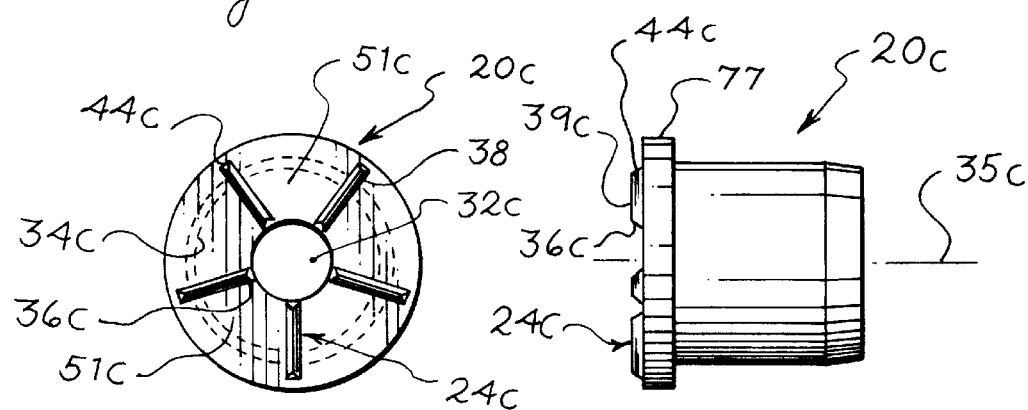
FIG. 14 is an enlarged elevational view of a boss.
FIG. 15 is an enlarged view of an end of a boss having a starburst array of energy directors.
Figure 16:
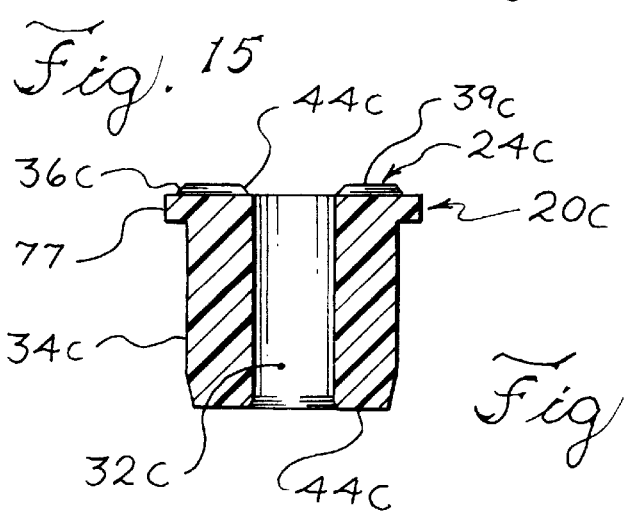
FIG. 16 is a cross-sectional view of the boss of FIG. 14.

In the embodiment of FIGS. 13–16, the energy directors are formed on the bottom wall 30 of a boss that is melded with and attached to another plastic part (FIG. 13). In the embodiment of FIGS. 1–5, 12 and 12A, a circular array of energy director protrusions are formed, which resembles a starburst array about a central aperture 32 in one end of a boss on a handle. This handle is shown attached to the bottle in FIGS. 1 and 12A.

In the embodiments of FIGS. 1–8, the boss 20 has a flat, circular bottom wall 30 with a plurality of radially extending protrusions 24, e.g., there being ten (10) protrusions 24 shown in FIGS. 1 and 3. The protrusions are spaced to cover most of the bottom wall 30 of the boss so that most of the entire bottom wall will be attached to the container wall. The protrusions 24 project radially inwardly from an outer, circumferential or cylindrical wall 34 for the boss toward the center of the boss, and terminate at inner ends 36 spaced from a center axis 35 for the boss. Typically, the protrusions are quite small and pointed with a base 38 (FIG. 5) and a thinner or narrower outer end wall 39 which abuts the second part. The protrusions may be, for example, 0.375 inch in length; 0.016 inch in width; and 0.016–0.020 inch in height. The illustrated protrusions are formed with either pointed outer end walls 39, as when the protrusion is triangular in cross-section, as shown in FIGS. 13–16. The preferred cross-sectional shape for the protrusions on the handle boss of FIGS. 1–5 are truncated, pyramids, i.a., a flat base 38 and a flat, narrow top outer end wall 39 with sloped sidewalls 40, as best seen in FIG. 5A. The ends 36 and 44 may also be slanted.

When it is desired to meld the plastics of the second part, e.g., the boss 20 to a first part, e.g., the bottle 12, the protrusions are forced with pressure and force to abut the wall 40 of the first part. The protrusions 24 act as energy directors for the ultrasonic energy which is emanating from the ultrasonic horn. Ultrasonic usually means vibrations of, e.g., 20,000 Hz or better; and these vibrations are transferred from an ultrasonic horn which abuts the top circular wall 42 (FIGS. 16 and 17) at the outer ends of the cylindrical wall 34. The vibrations are transferred through a cylindrical wall 34 of the boss to energy directing protrusions 24 arranged in a substantially circular array on the handle boss. The ultrasonic horn exerts a force to push the protrusions tightly against the bottle wall 40. The ultrasonic energy is directed to and concentrates at protrusions to create localized heating of the protrusions. The preferred circular array is in the shape of a starburst design with the energy directors 24 projecting inwardly from outer ends 44 toward inner ends 36. The inner ends 36 stop short of contacting one another. In the preferred embodiment, the hole or cavity 32 is formed at the center of the starburst array in the bottom wall so that the greater amount of ultrasonic energy being radiated inwardly along the protrusions is not concentrated, as would create too much heat at the center of the starburst array, such that there could be weakened plastic, burned plastic, or hole in the bottle. The starburst design provides a large area of weld between the parts so that the weld covers more surface area.

Stated differently, the ultrasonic horn contacts this upward-projecting, annular wall 34 and the vibrations pass down through this encircling wall 34 to the outer ends 44 of each of the energy directing protrusions 24 vibrating them simultaneously at their outer ends. Then, the vibrations pass radially inwardly along each of the protrusions toward their inner ends 36 which concentrate the heat because they occupy a smaller, inner diameter area at the inner ends than the larger, outer diameter area at the outer ends of the protrusions. The preferred embodiment has the hole 32 at the center of the starburst array so that vibrations moving radially inwardly cannot concentrate at the axis 35 and degrade the plastics being melded. Thus, the inner ends 36 do not create a hot spot or burn a hole in the bottle. The boss hole 32 also assists in assuring a good melting of the outer ends 44 of the protrusions by not letting all of the energy concentrate at the center area such that the outer ends would not vibrate sufficiently to melt them completely.

This starburst array of protrusions 24 appears to transfer vibrational energy to the container wall 40 to melt only the top or outer surface 50 (FIG. 6) of the plastic container for melding with the plastic of the protrusions 24. It has been found that, when the weld is broken by delaminating, that is, separating, the welded handle from the container, that there will not be a hole in the container to leak its contents. That is, the ultrasonic energy is concentrated at the pointed ends of the protrusions and causes a quicker melting of the protrusions themselves and the abutted contiguous plastic surface 50 of the container wall first, before there is a melting of the plastic area of the bottom wall 30 between the protrusions. The melted plastic from the protrusions flows sideways into the area or spaces 51 between adjacent protrusions 24 (FIGS. 1 and 8) and melds with the melted plastic in the areas that were formerly spaces.

In FIGS. 9, 10 and 11 is shown another shape for the handle, and the handle 14a of FIGS. 9, 10 and 11 has bosses 20a and energy directors 24a for attaching this shape of handle to a second article such as a bottle.

In the preferred embodiment of FIGS. 12 and 12A, the handle 14b is formed with a circular loop 60 at one end which may looped about a neck 62 of a plastic container 12b. To facilitate the loop passing over an annular shoulder 63 on the container and into a smaller diameter annular groove 64, the loop is preferably formed with a slit 65 (FIG. 12) where the loop or ring is integrally attached to a handle portion 66, which will be gripped by the user. At the other end of the handle 14b is formed a starburst of protrusions 24b around a central hole 32b. The illustrated handle 14b lacks an enlarged boss with a circumferential 34, such as that previously described, although such a boss could be added to the end of the handle.

As best seen in FIG. 12A, the bottle 12b has an indented lower wall 70 with a recess or cavity 72. A central portion 73 of the bottom wall is secured to the protrusions 24b on the handle 14b. Alternatively, a separate boss and fastener could be used at the bottom wall to secure the handle 14b to the container, as was disclosed in copending patent application Ser. No. 650,988, filed May 21, 1996.

The plastic handle 14b is shown in the form of a flexible strap having living hinge portions 66b formed therein to facilitate bending into the U-shape shown in FIG. 12A. Alternatively, the handle may be a more rigid plastic handle molded into the shape shown in FIG. 12 and more like that described in connection with FIGS. 1–5.

The handle may be of a soft, flexible, plastic material; and the smaller diameter opening 72 may be pulled over the shoulder 60 while stretching and flexing at the slit 65, and then allowed to return to its smaller diameter in the container neck groove. Thus, the upper end of the handle may be secured to the container neck. Because the handle 14b is of a soft, flexible and thin plastic material, it can be pushed against the sidewall of the container and not interfere with the packaging of adjacent containers. A rigid plastic handle 14b is preferred. Particularly, for large containers, e.g., three or more liters, the rigid handle allows pouring from the container in a horizontal position when the container cap is removed.

Referring now to the embodiment of the invention, which is shown in FIGS. 13–16, the first part is a plastic boss 20c that has no handle or other portion such as the portion 80 (FIG. 7) attached hereto. The boss will typically be used to receive a threaded metal screw (not shown) or plastic fastener (not shown) to connect another part to the boss, which will be integrally attached by melding the plastics of the boss 20c and a plastic substrate 76 (FIG. 13). The illustrated boss 20c has an enlarged flange 77 at its attaching end, and the bottom wall 30c is provided a circular array of protrusions 24c. The protrusions extend radially from outer ends 44c to inner ends 36c which are preferably slanted end walls, i.e., inclined to a vertical axis 35c for the cylindrical boss. The energy projectors have outer ends 39c that are either sharply pointed or have a flattened end of the truncated pyramidal cross-section. The protrusions act as energy directors, as above-described, when an ultrasonic horn is brought into contact with upper annular rim 42c (FIG. 16) of the boss. These vibrations pass through a cylindrical wall 34c for the boss to the bottom flange 77, and into the protrusions 24c that are pressed with force against the surface 50c of the substrate. The plastics of the protrusions first melt, as shown in the left portion of FIG. 13, at areas 82 and the outer surface 50c of the substrate. Then, the plastic of the protrusions flows laterally into spaces 51c between protrusions, as the entire bottom surface of the flange melts and mixes with the plastic of the substrate. Preferably, a hole or bore 32c is formed in the boss and is located at the center of the circular array of protrusions. When the intermixed plastics cool and solidify, the boss is integrally joined to the substrate at the solidified weld areas 80 and 82 (FIG. 13). When a cut is made through the weld area of melded plastics, the size or location of the protrusions is usually no longer discernible.

The term "circular array" or "starburst" is meant to include other arrangements or forms of protrusions that are centered about a central axis whether or not the protrusions actually are along a radius emanating from the central axis of the array. While the arrangement of protrusions may be changed from what one would call a starburst, it is their manner of functioning to produce the results herein attained with the preferred starburst design that is within the purview of this invention.

From the foregoing, it will be seen that there is a new and improved method of fastening plastic members together using a starburst or circular array of energy director protrusions on at least one of the members. The ultrasonic energy from the ultrasonic horn is concentrated at the protrusions causing them to melt before the plastic between the protrusion melts; and the space between adjacent protrusions allows the melted plastic of the protrusions to have a space in which to flow, thereby eliminating a bulge or expansion that may occur when abutting two smooth, plastic surfaces together and welding them ultrasonically. The circular array of protrusions usually are positioned to cover the area where the bond is to be made so that the bond may be a complete one, e.g., around a 360° circumference for a circular area where the protrusions were located prior to being melded into the melted plastic of the other part. Manifestly, the first and second parts may be of any shape or size and need not have a boss shape thereon, although the boss shape is preferred. Likewise, it is preferred to have a central opening or hole in the center of the starburst design to prevent overheating, forming a bulge, or a charred or darkened spot otherwise denigrating the plastics at the center of the melded area joining the parts together.

What is claimed is:

1. A method of securing a first plastic member to a second plastic member comprising the steps of:

provide a first plastic member;

providing a second plastic member with spaced protrusions projecting from a face wall on the first plastic member and arranged in a circular array with spaces between adjacent protrusions;

placing the circular array of protrusions against a facing surface on a wall of the first plastic member;

applying a force between the protrusions and the first plastic wall to force the protrusions and the first plastic wall together;

directing ultrasonic energy to a circular arrangement of protrusions with the protrusions serving as energy directors to concentrate the ultrasonic energy at the protrusions to melt the protrusions first in a substantially radial direction and directing ultrasonic energy from the protrusions to abutted areas of the facing surface of the first plastic member wall to bring them into a flowable condition;

intermixing the melted plastic of the circular array of protrusions with the melted plastic of the facing surface of the first plastic member;

allowing the intermixed plastics to solidify to form an integral bond between the first plastic member and the second plastic member; and providing the circular array of protrusions on a face wall of a boss having a central aperture; and using the aperture to limit concentration of energy at a center axis through the boss.

2. A method of securing a first plastic member to a second plastic member comprising the steps of:

providing a first plastic member;

providing a second plastic member with spaced protrusions protecting from a face wall on the first plastic member and arranged in a circular array with spaces between adjacent protrusions;

placing the circular array of protrusions against a facing surface on a wall of the first plastic member;

applying a force between the protrusions and the first plastic wall to force the protrusions and the first plastic wall together;

directing ultrasonic energy to a circular arrangement of protrusions arranged about an axis with the protrusions serving as energy directors to concentrate the ultrasonic energy at the protrusions to melt the protrusions first in a substantially radial direction and directing ultrasonic energy from the protrusions to abutted areas of the facing surface of the first plastic member wall to bring them into a flowable condition;

intermixing the melted plastic of the circular array of protrusions with the melted plastic of the facing surface of the first plastic member;

allowing the intermixed plastics to solidify to form an integral bond between the first plastic member and the second plastic member; the second plastic member comprising a handle, and the first plastic member comprising a plastic container including the step of:

providing the circular arrangement of protrusions and concentrating the heat energy about the axis of the circular arrangement to first melt the radially inner portion of the protrusions on the handle and forming a circular integral bond between each of these protrusions and the container over substantially an entire area defined by the circular arrangement.

3. A method in accordance with claim 2 including the step of:

blowing a preform of PET plastic into a plastic container; and subsequently bonding a handle of PET plastic to the container wall.

4. A method of securing a first plastic member to a second plastic member comprising the steps of:

providing a first plastic member;

providing a second plastic member with spaced protrusions protecting from a face wall on the first plastic member and arranged in a circular array with spaces between adjacent protrusions;

placing the circular array of protrusions against a facing surface on a wall of the first plastic member;

applying a force between the protrusions and the first plastic wall to force the protrusions and the first plastic wall together;

directing ultrasonic energy to a circular arrangement of protrusions with the protrusions serving as energy directors to concentrate the ultrasonic energy at the protrusions to melt the protrusions first in a substantially radial direction and directing ultrasonic energy from the protrusions to abutted areas of the facing surface of the first plastic member wall to bring them into a flowable condition;

intermixing the melted plastic of the circular array of protrusions with the melted plastic of the facing surface of the first plastic member;

allowing the intermixed plastics to solidify to form an integral bond between the first plastic member and the second plastic member; the second plastic member being a boss with a hollow bore therein, and including the step of:

applying ultrasonic energy to an outer side of the boss and vibrating the circular array of protrusions to melt and to intermix with the plastic of the boss with the plastic of the first plastic member about the hollow bore.

5. A method of securing a first plastic part to a second plastic part comprising the steps of:

providing a circular array of protrusions having outer ends spaced outwardly from a center axis for the circular array and having inner ends closed adjacent (J: to?) the center axis:

using the protrusions to serve as energy directors;

applying ultrasonic energy to the circularly arranged energy directors from the outer ends of the protrusions and passing the vibrations inwardly toward a central axis for the circular array to melt the protrusions and the adjacent surface of the second part;

intermixing the melted plastics of the first and second parts and allowing the plastic to solidify;

providing the second plastic member in the shape of a boss with a bottom wall with the energy directors being in the form of spaced protrusions projecting outwardly from the bottom wall;

applying an ultrasonic horn to an outer cylindrical rim wall on the boss;

providing the boss with a central opening and locating the circular array of protrusions about the opening; and limiting the concentration of heat from the ultrasonic energy at the center of the circular array of protrusions by the use of the opening.

* * * * *

UNITED STATES PATENT AND TRADEMARK OFFICE
CERTIFICATE OF CORRECTION

PATENT NO. : 5,861,072
DATED : January 19, 1999
INVENTOR(S) : James Medal

It is certified that error appears in the above-indentified patent and that said Letters Patent is hereby corrected as shown below:

In the Claims:

Column 7, line 36, change "protecting" to --projecting--.

Column 8, line 11, change "protecting" to --projecting--.

Column 8, line 43, change "adjacent(J:to?)" to --adjacent--.

Signed and Sealed this

Sixth Day of July, 1999

*Attest:*

Q. TODD DICKINSON

*Attesting Officer*  *Acting Commissioner of Patents and Trademarks*